(12) United States Patent
Li et al.

(10) Patent No.: US 9,984,882 B2
(45) Date of Patent: May 29, 2018

(54) SEMICONDUCTOR STRUCTURES AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yong Li, Shanghai (CN); Zhongshan Hong, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/275,111

(22) Filed: Sep. 23, 2016

(65) Prior Publication Data

US 2017/0117154 A1    Apr. 27, 2017

(30) Foreign Application Priority Data

Oct. 26, 2015    (CN) .......................... 2015 1 0702088

(51) Int. Cl.
 *H01L 21/28* (2006.01)
 *H01L 21/02* (2006.01)
 (Continued)

(52) U.S. Cl.
 CPC .. *H01L 21/28158* (2013.01); *H01L 21/02247* (2013.01); *H01L 21/02255* (2013.01);
 (Continued)

(58) Field of Classification Search
 CPC ......... H01L 21/28158; H01L 21/02247; H01L 29/66545; H01L 29/517; H01L 29/513; H01L 29/518; H01L 21/02359; H01L 21/02332; H01L 21/02255; H01L 21/0214; H01L 21/02194; H01L 21/02189; H01L 21/02181; H01L 21/02178; H01L 21/0217;
 (Continued)

(56) References Cited

U.S. PATENT DOCUMENTS

2006/0131675 A1    6/2006  Wang et al.
2008/0070395 A1    3/2008  Yen et al.
 (Continued)

*Primary Examiner* — Caleen Sullivan
(74) *Attorney, Agent, or Firm* — Anova Law Group, PLLC

(57) ABSTRACT

A method for fabricating a semiconductor structure includes providing a substrate, forming an interface layer on the substrate, and then performing a first annealing process on the interface layer under a nitrogen-containing environment to form a nitrogen-containing layer from a top portion of the interface layer. The first annealing process also deactivates non-bonded silicon ions and oxygen ions in the interface layer. The method further includes forming a high-k dielectric layer on the nitrogen-containing layer, and performing a second annealing process on the high-k dielectric layer to allow nitrogen ions in the nitrogen-containing layer to diffuse into the high-k dielectric layer to reduce a density of active oxygen vacancies in the high-k dielectric layer. Finally, the method includes forming a gate electrode layer on the high-k dielectric layer.

19 Claims, 6 Drawing Sheets

(51) Int. Cl.
    *H01L 29/51*         (2006.01)
    *H01L 29/66*         (2006.01)

(52) U.S. Cl.
    CPC .. *H01L 21/02332* (2013.01); *H01L 21/02359* (2013.01); *H01L 29/513* (2013.01); *H01L 29/517* (2013.01); *H01L 29/518* (2013.01); *H01L 29/66545* (2013.01); *H01L 21/0214* (2013.01); *H01L 21/0217* (2013.01); *H01L 21/02148* (2013.01); *H01L 21/02164* (2013.01); *H01L 21/02178* (2013.01); *H01L 21/02181* (2013.01); *H01L 21/02189* (2013.01); *H01L 21/02194* (2013.01); *H01L 29/66795* (2013.01)

(58) Field of Classification Search
    CPC ......... H01L 21/02164; H01L 21/02148; H01L 29/66795
    USPC ........................................................ 438/287
    See application file for complete search history.

(56) References Cited

U.S. PATENT DOCUMENTS

| | | |
|---|---|---|
| 2008/0121962 A1 | 5/2008 | Forbes et al. |
| 2012/0025327 A1 | 2/2012 | Ji |
| 2013/0330843 A1 | 12/2013 | Chudzik |
| 2015/0035084 A1 | 2/2015 | Li et al. |
| 2015/0069534 A1 | 3/2015 | Ke et al. |
| 2015/0102431 A1 | 4/2015 | Chi et al. |

SEMICONDUCTOR STRUCTURES AND FABRICATION METHOD THEREOF

CROSS-REFERENCES TO RELATED APPLICATIONS

This application claims the priority of Chinese Patent Application No. CN201510702088.6, filed on Oct. 26, 2015, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

The main semiconductor devices in integrated circuits, especially in very-large-scale integrated circuits, include metal-oxide-semiconductor (MOS) transistors. With continuous development of the fabrication technology of integrated circuits, the semiconductor technology node steadily shrinks and the geometry dimension of semiconductor structures continuously decreases following the Moore's law. When the dimension of semiconductor structures shrinks to a certain value, various secondary effects due to approaching the physical limit of the semiconductor structures may emerge successively. Further scaling down the feature size of semiconductor structures becomes more and more difficult. Specifically, in the field of semiconductor fabrication, one of the most challenging issues is to solve the problem of having a large leakage current in semiconductor structures. A main reason for such a large leakage current is the continuous decrease of the thickness of the gate dielectric layer in traditional semiconductor structures.

Currently, a method proposed to reduce the leakage current is to use a high-k dielectric material to replace the traditional $SiO_2$ dielectric material while use a metal to form the gate electrode. Specifically, using a metal, instead of a traditional gate electrode material, to form the gate electrode may avoid the Fermi energy pinning effect between the traditional gate electrode material and the high-k dielectric material. In addition, using a metal to form the gate electrode may also avoid the boron diffusion effect. Therefore, the introduction of high-k metal gate (HKMG) may reduce the leakage current in semiconductor structures.

Although introducing HKMG may, to some extent, improve the electrical performance of semiconductor structures, many aspects of existing semiconductor structures and fabrication methods still need to be further improved. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method includes providing a substrate, forming an interface layer on the substrate, and then performing a first annealing process on the interface layer under a nitrogen-containing environment to form a nitrogen-containing layer from a top portion of the interface layer. The first annealing process also deactivates non-bonded silicon ions and oxygen ions in the interface layer. The method further includes forming a high-k dielectric layer on the nitrogen-containing layer, and performing a second annealing process on the high-k dielectric layer to allow nitrogen ions in the nitrogen-containing layer to diffuse into the high-k dielectric layer to reduce a density of active oxygen vacancies in the high-k dielectric layer. Finally, the method includes forming a gate electrode layer on the high-k dielectric layer.

Another aspect of the present disclosure provides another method for fabricating a semiconductor structure. The method includes providing a substrate, forming an interface layer on the substrate, and forming a high-k dielectric layer on the interface layer. The method then includes performing a first annealing process on the high-k dielectric layer and the interface layer under a nitrogen-containing environment to allow nitrogen ions from the nitrogen-containing environment and non-bonded oxygen ions in the interface layer to respectively diffuse into the high-k dielectric layer to reduce a density of active oxygen vacancies in the high-k dielectric layer. Finally, the method includes forming a gate electrode layer on the high-k dielectric layer.

Another aspect of the present disclosure provides a semiconductor structure. The semiconductor structure includes a substrate, a plurality of gate structures formed on the substrate, and an interlayer dielectric layer formed on the substrate and covering sidewall surfaces of each gate structure. Each gate structure further includes an annealed interface layer formed on the substrate, an annealed high-k dielectric layer formed above the annealed interface layer, and a gate electrode layer formed on the annealed high-k dielectric layer. The annealed high-k dielectric layer has a reduced density of active oxygen vacancies.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In existing semiconductor structures, the use of a high-k dielectric material for the gate dielectric layer may improve the electrical performance of the semiconductor structure to a certain degree. For example, the leakage current in the semiconductor structure may decrease. However, the dielectric relaxation current (DR current) in the semiconductor structure may still be large, leading to undesired electrical performance for the semiconductor structure. For example, the positive bias temperature instability (PBTI) characteristics and the negative bias temperature instability (NBTI) characteristics may still evidently exist. Further, existence of such a large DR current in semiconductor structures may be caused by defects in the high-k dielectric material. Specifically, defects in the high-k dielectric material may lead to electron traps, which further result in remarkable dielectric relaxation for the high-k dielectric material. Thus, the high-k dielectric material may have a relatively large loss angle.

Moreover, defects in the high-k dielectric material mainly include oxygen vacancies. Therefore, the electrical performance of the semiconductor structure is expected to be significantly improved when the density of active oxygen vacancies in the high-k dielectric material is reduced.

Figure 12:
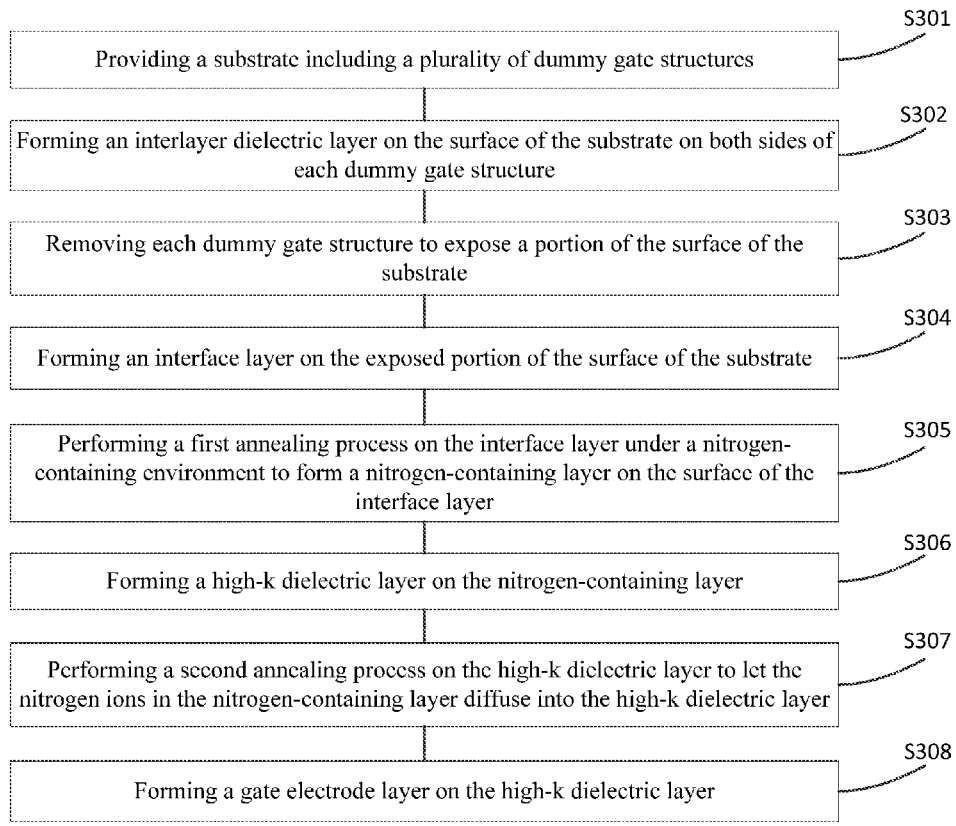
FIG. 12 illustrates a flowchart of an exemplary fabrication process for a semiconductor structure consistent with disclosed embodiments in the present disclosure.

In view of the above problems, the present disclosure provides a method for fabricating a semiconductor device. FIG. 12 shows a flowchart of an exemplary fabrication process for a semiconductor structure consistent with disclosed embodiments. FIGS. 1-8 show schematic cross-section views of semiconductor structures at certain stages of an exemplary fabrication process consistent with disclosed embodiments.

Figure 1:
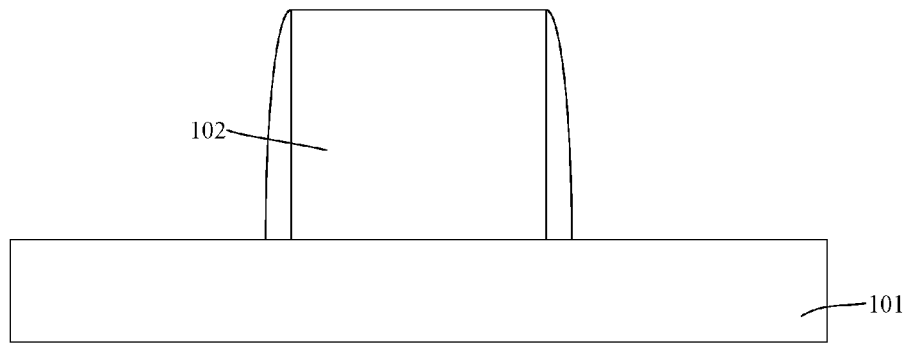
FIGS. 1-8 illustrate schematic cross-section views of semiconductor structures at certain stages of an exemplary fabrication process consistent with disclosed embodiments in the present disclosure.

Referring to FIG. 12, at beginning of the fabrication process, a substrate including a plurality of dummy gate structures is provided (S301). FIG. 1 shows a schematic cross-section view of the corresponding semiconductor structure.

Referring to FIG. 1, a substrate 101 is provided. A plurality of dummy gate structures 102 may be formed on the substrate 101. For illustration purposes, only one dummy gate structure 102 formed the substrate 101 is shown in FIG. 1. The actual number of dummy gate structures formed on the substrate 101 may be more than one.

The substrate 101 may be made of silicon, germanium, SiGe, SiC, GaAs, InAs, or any other appropriate semiconductor material. The substrate 101 may also be made of silicon on insulator (SOI) or germanium on insulator (GOI). In one embodiment, the substrate 101 is made of silicon.

A plurality of isolation structures (not shown) may also be formed in the substrate 101. The plurality of isolation structures may be used to electrically isolate neighboring active areas (AAs).

Each dummy gate structure 102 may be used to pre-occupy a space for a subsequently-formed gate structure. The dummy gate structures 102 may be made of $SiO_x$, polycrystalline silicon, $SiN_x$, SiON, SiC, SiCN, SiCON, or amorphous silicon. In one embodiment, the dummy gate structures 102 are made of polycrystalline silicon. Further, in order to prevent damages on the substrate 101 during a subsequent etching process to remove the dummy gate structures 102, an oxide layer may be formed between each dummy gate structure 102 and the substrate 101.

In one embodiment, the fabrication process for the dummy gate structures 102 may include the following steps. First, a dummy gate film may be formed on the surface of the substrate 101. Then a portion of the dummy gate film formed on the substrate 101 may be removed to form the dummy gate structures 102. In one embodiment, a sidewall spacer (not labeled) may be formed on each sidewall surface of the dummy gate structures 102, and the sidewall spacer is made of $SiN_x$.

Further, after forming the dummy gate structures 102, the fabrication process may also include forming a source region and a drain region in the substrate 101 on the two sides of each dummy gate structure 102. In one embodiment, the semiconductor structure to be formed is a PMOS device; accordingly, the source region may be doped with P-type ions, such as B, Ga, In, etc. In another embodiment, the semiconductor structure to be formed is an NMOS device; accordingly, the source region and the drain region may be doped with N-type ions, such as P, As, Sb, etc.

In other embodiment, the semiconductor structure to be formed may include a plurality of fin field-effect-transistors (Fin-FETs). Accordingly, the semiconductor structure may include a plurality of discrete fin structures formed on the surface of the substrate and an isolation layer formed on the surface of the substrate. Specifically, the isolation layer may cover a portion of the sidewall surfaces of the fin structures with the top surface of the isolation layer lower than the top surface of the fin structures. Accordingly, the dummy gate structures may be formed on a portion of the surface of the isolation layer and across the fin structures. Each dummy gate structure may cover a portion of the top and the sidewall surfaces of the corresponding fin structure. Moreover, a source region as well as a drain region may be formed in each fin structure on the two sides of the corresponding dummy gate structure.

Figure 2:
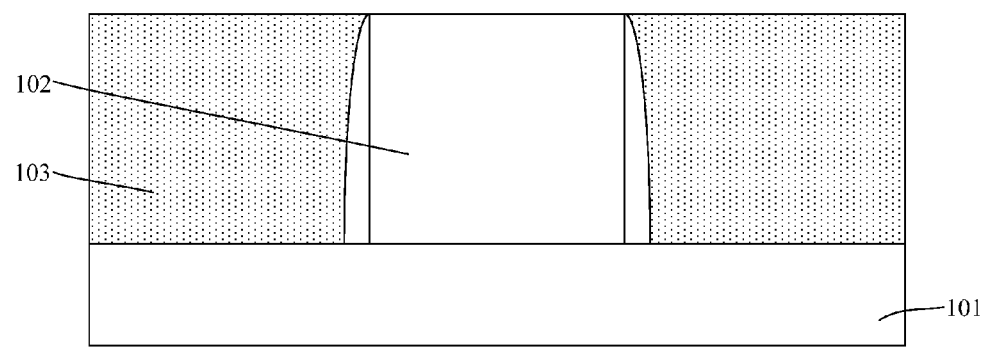

Further, returning to FIG. 12, an interlayer dielectric layer may be formed on the surface of the substrate on both sides of each dummy gate structure (S302). FIG. 2 shows a cross-section view of the corresponding semiconductor structure.

Referring to FIG. 2, an interlayer dielectric layer may be formed in the substrate 101 on the two sides of each dummy gate structure 102. The interlayer dielectric layer 103 may cover the sidewall surfaces of the plurality of dummy gate structures 102.

The top of the interlayer dielectric layer 103 may be leveled with the top of the plurality of dummy gate structures 102. The fabrication process for the interlayer dielectric layer 103 may include the following steps. First, an interlayer dielectric film may be formed on the surface of the substrate on the two sides of each dummy gate structure 102. The interlayer dielectric film may cover the top and the sidewall surfaces of the dummy gate structures 102 with the top surface of the interlayer dielectric film higher than the top surfaces of the dummy gate structures 102. Further, the portion of the interlayer dielectric film formed above the top surfaces of the dummy gate structures 102 may be removed to form the interlayer dielectric layer 103.

The interlayer dielectric layer 103 may be made of $SiO_x$, $SiN_x$, SiON, SiCON, or any other appropriate dielectric material. In one embodiment, the material used to form the interlayer dielectric layer 103 may be different from the material used to form the dummy gate structures 102. The interlayer dielectric layer 103 may be made of $SiO_x$.

Figure 3:
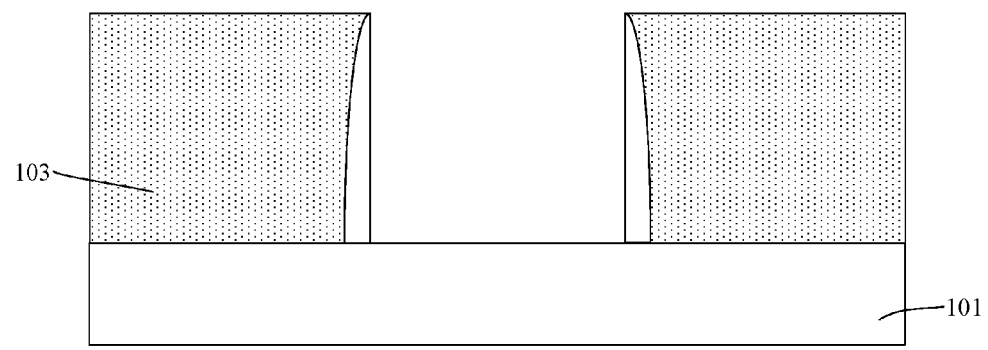

Further, returning to FIG. 12, the plurality of dummy gate structures may be removed to expose a portion of the surface of the substrate (S303). FIG. 3 shows a schematic cross-section view of the corresponding semiconductor structure.

Referring to FIG. 3, the plurality of dummy gate structures 102 (referring to FIG. 2) may be removed to expose a portion of the surface of the substrate 101. In one embodiment, the plurality of dummy gate structures 102 may be removed by a dry etching process. Specifically, during the dry etching process, the etch rate on the dummy gate structures 102 may be larger than the etch rate on the interlayer dielectric layer 103.

Figure 4:
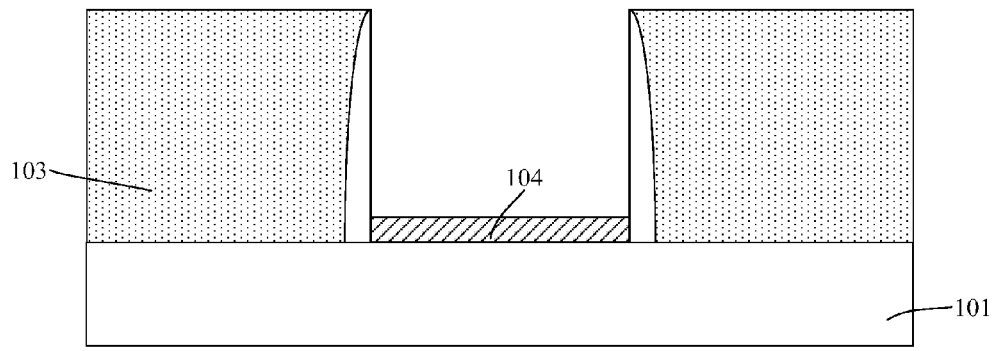

Returning to FIG. 12, further, an interface layer may be formed on the exposed portion of the surface of the substrate (S304). FIG. 4 shows a schematic cross-section view of the corresponding semiconductor structure.

Referring to FIG. 4, an interface layer 104 may be formed on the surface of the substrate 101. In one embodiment, the interface layer 104 may be formed on a portion of the surface of the substrate 101. Specifically, the interface layer 104 may be formed on the exposed portion of the surface of the substrate 101. The interface layer 104 may be formed for two purposes. First, the interface layer 104 may serve as a component of the gate structure to be formed. Specifically, the interface layer 104, together with a subsequently-formed high-k dielectric layer, may form a double-layer structure serving as the gate dielectric layer for the gate structure. Second, the interface layer 104 may provide a desired interface for further forming the high-k dielectric layer so that the quality of the formed high-k dielectric layer may be improved and negative effects due to direct contact between the high-k dielectric layer and the substrate 101 may also be avoided.

The interface layer 104 may be made of $SiO_x$, $SiN_x$, SiCON, or any other appropriate material. The interface layer 104 may be formed by chemical vapor deposition (CVD), physical vapor deposition (PVD), or atomic layer deposition (ALD). The interface layer 104 may also be formed through an oxidation process.

In one embodiment, the interface layer 104 is made of $SiO_x$. The interface layer 104 may be formed on the exposed portion of the surface of the substrate 101 through a thermal oxidation process in order to improve the properties of the interface between the interface layer 104 and the substrate 101. The thermal oxidation process may use dry oxygen or wet oxygen for oxidation. During the thermal oxidation process to form the interface layer 104, an oxygen-containing gas may be sent into the reaction chamber. Moreover, a silicon-containing gas may also be sent into the reaction chamber in order to reduce the oxidation rate on the substrate during the thermal oxidation process.

In one embodiment, the process parameters used in the thermal oxidation process to form the interface layer 104 may include an oxidizing gas including one or more of $O_2$, $H_2O$, NO, $N_2O$, etc., a flow rate of the oxidizing gas in a range of 10 sccm to 100 sccm, a chamber temperature in a range of 500° C. to 850° C.

Figure 5:
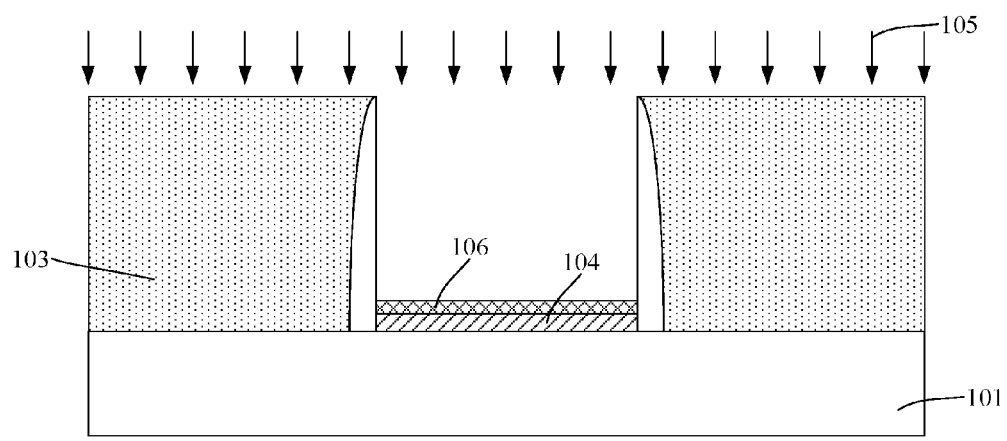

Further, returning to FIG. 12, a first annealing process under a nitrogen-containing environment may be performed on the interface layer to form a nitrogen-containing layer (S305). FIG. 5 shows a schematic view of the first annealing process.

Referring to FIG. 5, a first annealing process 105 may be performed on the interface layer 104. The first annealing process 105 may be performed under a nitrogen-containing environment and, thus, a nitrogen-containing layer 106 may be formed on the surface of the interface layer 104.

Prior to performing the first annealing process 105, the interface layer 104 may contain non-bonded silicon ions and non-bonded oxygen ions. Therefore, the interface layer 104 may not have desired properties. For instance, the electrical isolation properties and the compactness of the interface layer 104 may be poor. The first annealing process 105 may be conducive to deactivating the non-bonded silicon ions and the non-bonded oxygen ions. The non-bonded silicon ions and the non-bonded oxygen ions may undergo a chemical bond reconstruction process such that the properties of the interface layer 104 may be improved. Thus, the insulation properties and the compactness of the interface layer 104 may be improved.

Moreover, because the first annealing process 105 may be performed under a nitrogen-containing environment, the nitrogen ions from the nitrogen-containing environment may be bonded with silicon ions and oxygen ions at the surface of the interface layer 104. Therefore, a nitrogen-containing layer 106 may be formed at the surface of the interface layer 104. During a second annealing process performed on a subsequently-formed high-k dielectric layer, the nitrogen ions in the nitrogen-containing layer 106 may diffuse into the high-k dielectric layer. Therefore, the nitrogen-containing layer 106 may help the deactivation of the oxygen vacancies in the high-k dielectric layer, and thus may reduce the density of active oxygen vacancies in the high-k dielectric layer.

The first annealing process 105 may use a gas including $NH_3$. In one embodiment, the process parameters used in the first annealing process 105 may include an annealing temperature in a range of 400° C. to 1100° C., a chamber pressure in a range of 1 Torr to 1 atm., an annealing time in a range of 10 minutes to 120 minutes. Using the process parameters described above for the first annealing process, nitrogen ions may not diffuse into the substrate 101, and secondary diffusion of doping ions in the source/drain regions due to an overly high annealing temperature may be avoided. In the meantime, the annealing temperature and the chamber pressure may both be in a moderate range so that the properties of the interface layer 104 may be significantly improved. In addition, a relatively large density of nitrogen ions in the nitrogen-containing layer 106 may be ensured, which may further reduce oxygen vacancies in the high-k dielectric layer.

In other embodiments, besides the nitrogen-containing gas, a fluorine-containing gas and/or a hydrogen-containing gas may also be used in the first annealing process. That is, the process environment may also include a fluorine-containing gas and/or a hydrogen-containing gas in addition to the nitrogen-containing gas. Accordingly, the nitrogen-containing layer may also contain one or both of fluorine ions and hydrogen ions. The gas used in the first annealing process may also include $NF_3$ or $H_2$. Specifically, in one embodiment, the first annealing process may be performed under an environment containing both nitrogen ions and fluorine ions. For example, the gas used in the first annealing process may include $NH_3$ and $NF_3$. In another embodiment, the first annealing process may be performed under an environment containing both nitrogen ions and hydrogen ions. For example, the gas used in the first annealing process may include $NH_3$ and $H_2$. In another embodiment, the first annealing process may be performed under an environment containing nitrogen ions, hydrogen ions, and fluorine ions. For example, the gas used in the first annealing process may include $NH_3$, $NF_3$, and HF.

Figure 6:
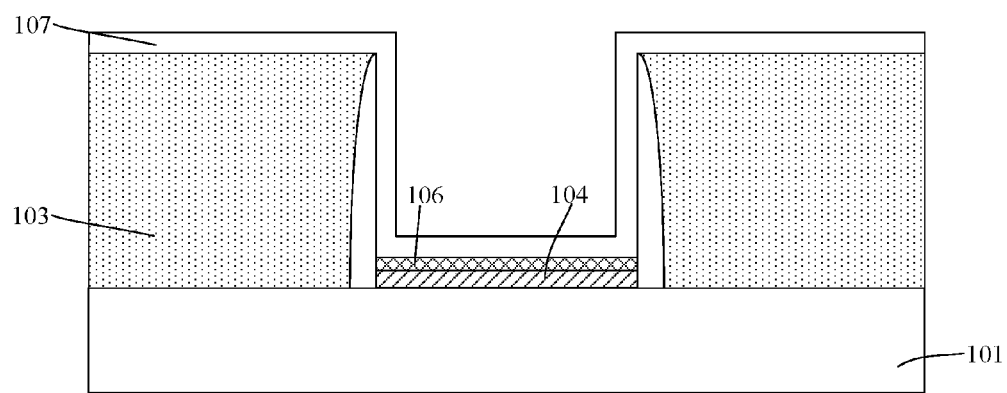

Further, returning to FIG. 12, a high-k dielectric layer may be formed on the nitrogen-containing layer (S306). FIG. 6 shows a schematic cross-section view of the corresponding semiconductor structure.

Referring to FIG. 6, a high-k dielectric layer 107 may be formed on the surface of the nitrogen-containing layer 106. The high-k dielectric layer 107 may be formed of a high-k dielectric material. The high-k dielectric material may refer to a material with a dielectric constant greater than the relative dielectric constant of $SiO_2$. Specifically, the high-k dielectric layer 107 may be made of $HfO_2$, HfSiO, HfSiOn, HfTaO, HfTiO, HfZrO, $ZrO_2$, or $Al_2O_3$.

The high-k dielectric layer 107 may be formed by a CVD, PVD, or ALD process. In one embodiment, the high-k dielectric layer 107 may be made of $HfO_2$ and formed by a CVD process.

Figure 7:
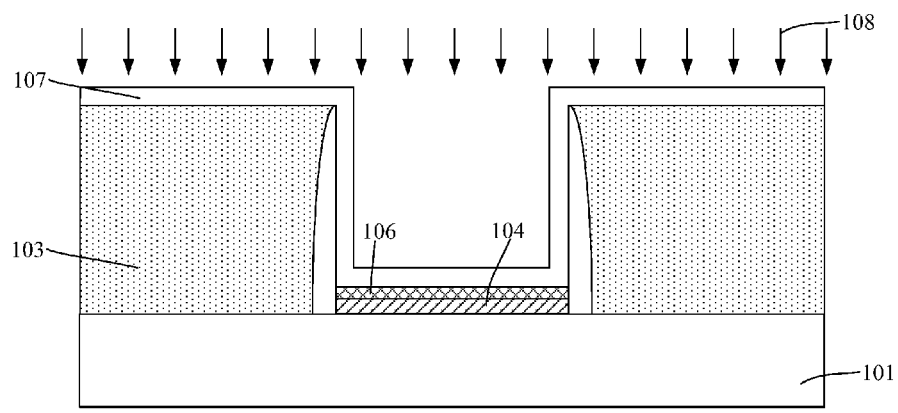

Further, returning to FIG. 12, a second annealing process may be performed on the high-k dielectric layer to let the nitrogen ions in the nitrogen-containing layer diffuse into the high-k dielectric layer (S307). FIG. 7 shows a schematic view of the second annealing process.

Referring to FIG. 7, a second annealing process 108 may be performed on the high-k dielectric layer 107 to let the nitrogen ions in the nitrogen-containing layer 106 diffuse into the high-k dielectric layer 107.

The second annealing process may improve the compactness of the high-k dielectric layer 107 and also improve the relative dielectric constant of the high-k dielectric layer 107.

The second annealing process may also reduce the oxygen vacancies in the high-k dielectric layer 107. Specifically, most of the high-k dielectric materials may be ionic crystals and every metal ion in the high-k dielectric materials may have various bonds with oxygen ions. Oxygen vacancies may be easily formed in the absence of oxygen ions. The presence of oxygen vacancies may further induce in-gap states in the band gap of the high-k dielectric materials, and such in-gap states may form defect energy levels according to the conduction mechanism. When the high-k dielectric layer 107 is directly used as a portion of the gate dielectric layer in the formed gate structure, the dielectric relaxation issue may become significant in the formed semiconductor structure.

Therefore, in one embodiment, a second annealing process 108 may be performed on the high-k dielectric layer 107 to let the nitrogen ions in the nitrogen-containing layer 106 diffuse into the high-k dielectric layer 107. The diffused nitrogen ions may enter oxygen vacancies and form chemical bonds through orbital hybridization between the nitrogen ions and the metal ions in the high-k dielectric layer 107. For example, in the case where the high-k dielectric layer 107 is made of $HfO_2$, because the electronegativity of nitrogen ions is larger than the electronegativity of oxygen ions, the in-gap states on the Hf5d orbit may be pushed below the conduction band of $HfO_2$ so that the oxygen vacancies in the $HfO_2$ may be deactivated. Therefore, the dielectric relaxation issue in the high-k dielectric layer 107 may be suppressed, and the PBTI characteristics and the NBTI characteristics in the semiconductor structure may also be suppressed.

In one embodiment, the process parameters used in the second annealing process 108 may include an annealing temperature in a range of 400° C. to 1100° C., a chamber pressure in a range of 1 Torr to 1 atm., an annealing time in a range of 10 minutes to 120 minutes. During the second annealing process 108, nitrogen ions in the nitrogen-containing layer 106 may diffuse into the high-k dielectric layer 107. In the meantime, nitrogen ions may not diffuse into the substrate 101, and thus undesired doping to the channel region may be avoided during the second annealing process 108.

In other embodiments, when the nitrogen-containing layer also include fluorine ions and/or hydrogen ions, during the second annealing process, the fluorine ions and/or hydrogen ions in the nitrogen-containing layer may also diffuse into the high-k dielectric layer, and thus may further help deactivate the oxygen vacancies.

Prior to subsequently forming a gate electrode layer, a cover layer may be formed on the surface of the high-k dielectric layer 107. The cover layer may prevent metal ions in the subsequently-formed gate electrode layer from diffusing into the high-k dielectric layer 107.

Figure 8:
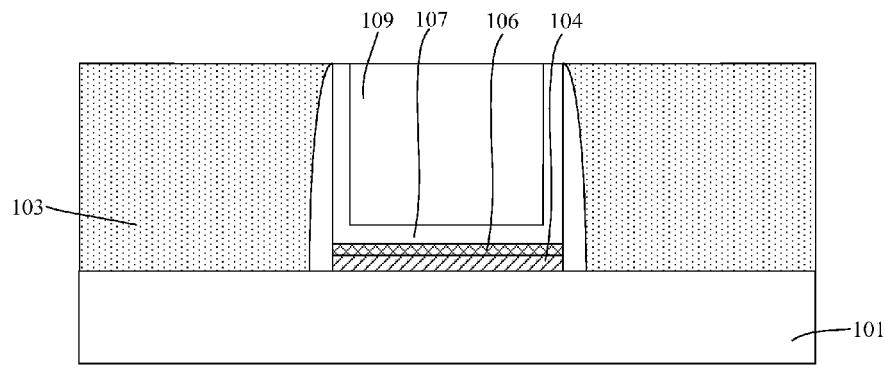

Further, returning to FIG. 12, a gate electrode layer may be formed on the surface of the high-k dielectric layer (S308). FIG. 8 shows a schematic cross-section view of the corresponding semiconductor structure.

Referring to FIG. 8, a gate electrode layer 109 may be formed on the surface of the high-k dielectric layer 107. In one embodiment, the top surface of the gate electrode layer 109 may be leveled with the top surface of the interlayer dielectric layer 103. During the formation process for the gate electrode layer 109, a portion of the high-k dielectric layer 107 formed higher than the top surface of interlayer dielectric layer 103 may also be removed.

In one embodiment, the gate electrode layer 109 may be formed by a process including the following steps. First, a gate electrode film may be formed on the surface of the high-k dielectric layer 107. The top surface of the formed gate electrode film may be higher than the top surface of the interlayer dielectric layer 103. Then, the portion of the gate electrode film exceeding the top surface of the interlayer dielectric layer 103 may be removed by polishing to form the gate electrode layer 109. The polishing process may be continued until the portion of the high-k dielectric layer 107 formed above the interlayer dielectric layer is removed.

The gate electrode layer 109 may have a single-layer structure or a multiple-layer structure. In one embodiment, the gate electrode layer 109 includes a work function layer (not shown) formed on the surface of the high-k dielectric layer 107 and an electrode layer (not shown) formed on the surface of the work function layer. The electrode layer may be made of a material including Al, Cu, Ag, Au, Pt, Ni, Ti, W, etc.

When the semiconductor structure to be formed is an NMOS device, the work function layer may be an N-type work function material including one or more of TiAl, TaAlN, TiAlN, MoN, TaCN, AlN, etc. When the semiconductor structure to be formed is a PMOS device, the work function layer may be a P-type work function material including one or more of Ta, TiN, TaN, TaSiN, TiSiN, etc.

In other embodiments, the gate electrode layer may have a single layer structure and the gate electrode layer may be made of one or more of Al, Cu, Ag, Au, Pt, Ni, Ti, W, etc.

In one embodiment, the oxygen vacancies in the high-k dielectric layer 107 may be reduced, the dielectric relaxation issue in the high-k dielectric layer 107 may be suppressed, and thus the relaxation current in the semiconductor structure may be reduced. Therefore, the disclosed fabrication methods and semiconductor structures may suppress the PBTI characteristics and the NBTI characteristics so that the electrical performance of the semiconductor structures may be improved.

Moreover, in one embodiment, the fabrication process for the HKMG is a high-k last metal gate last process. In other embodiments, the fabrication process for the HKMG may also use a high-k first metal gate last process. Specifically, an interface layer may be formed on the entire top surface of a substrate. A first annealing process may be performed to convert the top layer of the interface layer into a nitrogen-containing layer. A high-k dielectric layer may then be formed on the surface of the nitrogen-containing layer. Prior to further forming a gate electrode layer on the surface of the high-k dielectric layer, a second annealing process may be performed on the high-k dielectric layer. After forming the gate electrode layer on the surface of the annealed high-k dielectric layer, the gate electrode layer and the high-k dielectric layer may be patterned to form gate structure.

Further, a source region and a drain region may be formed in the substrate on the two sides of the gate structure. Finally, an interlayer dielectric layer may be formed on the surface of the substrate on both sides of the gate structure. The interlayer dielectric layer may cover the sidewall surfaces of the gate structure and the top surface of the interlayer dielectric layer may be leveled with the top surface of the gate structure.

Figure 9:
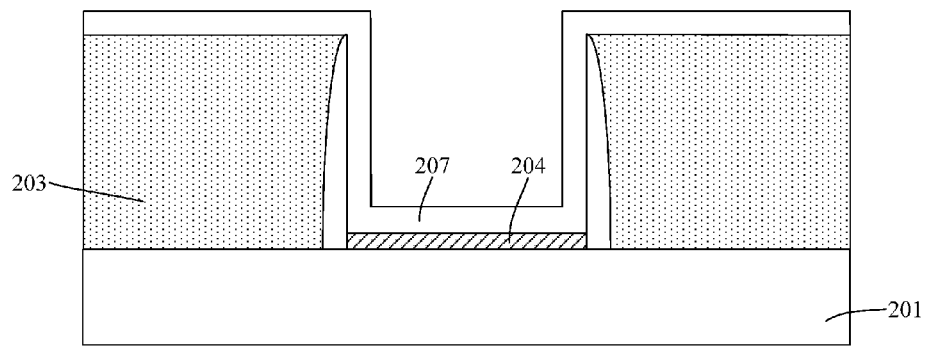
FIGS. 9-11 illustrate schematic cross-section views of semiconductor structures at certain stages of another exemplary fabrication process consistent with disclosed embodiments in the present disclosure.
Figure 10:
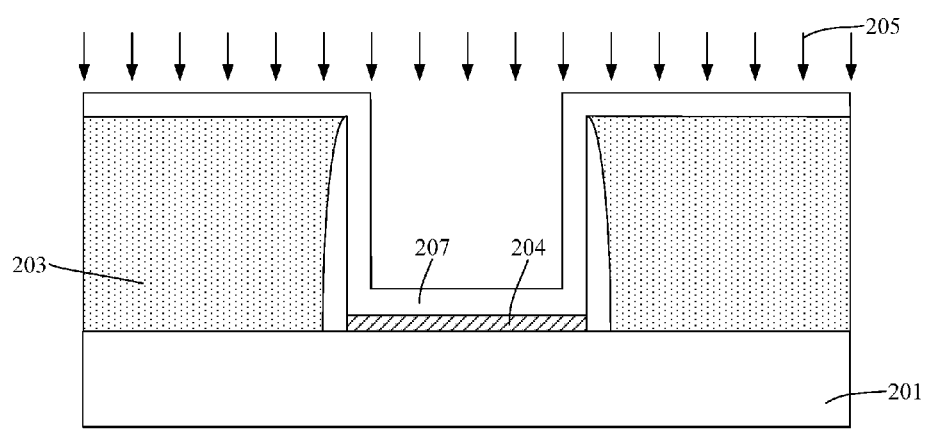
Figure 11:
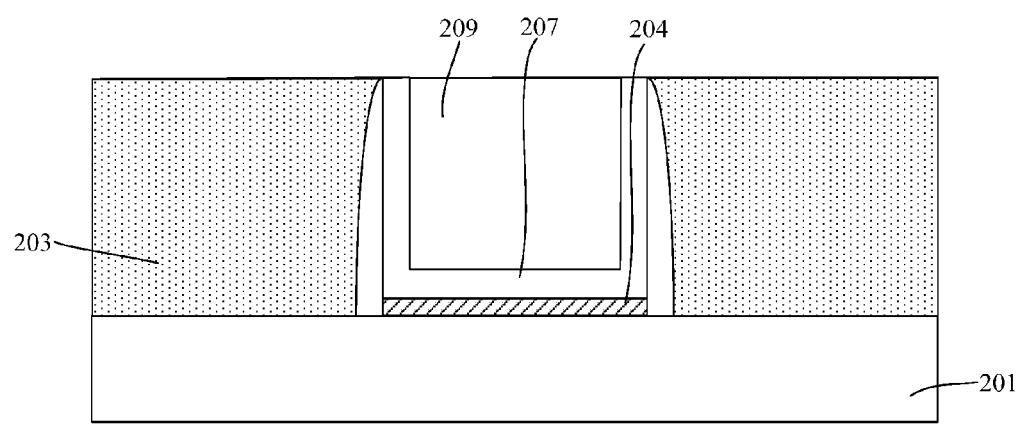
Figure 13:
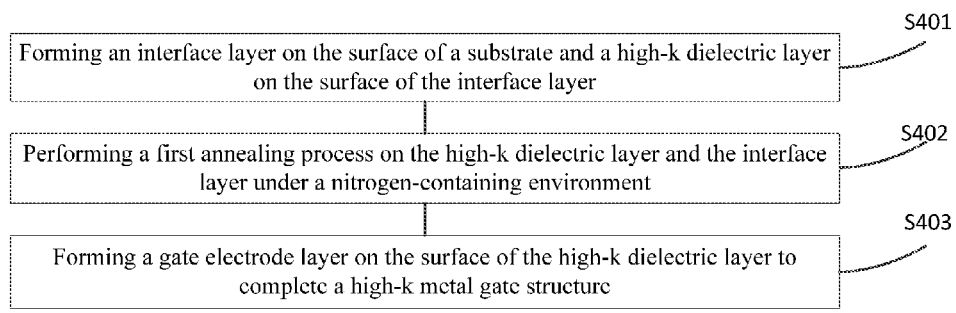
FIG. 13 illustrates a flowchart of another exemplary fabrication process for a semiconductor structure consistent with disclosed embodiments in the present disclosure.

The present disclosure also provides another fabrication method for a semiconductor structure. FIG. 13 shows a flowchart of the exemplary fabrication process consistent with disclosed embodiments. FIGS. 9-11 show schematic cross-section views of semiconductor structures at certain stages of the exemplary fabrication process.

Referring to FIG. 13, at the beginning of the fabrication process, an interface layer may be formed on the surface of a substrate and a high-k dielectric layer may then be formed on the surface of the interface layer (S401). FIG. 9 shows a schematic cross-section view of the corresponding semiconductor structure.

Referring to FIG. 9, at the beginning to the fabrication process, a substrate 201 is provided. An interface layer 204 may then be formed on the surface of the substrate 201. Further, a high-k dielectric layer 207 may be formed on the surface of the interface layer 204.

In one embodiment, the fabrication process for the HKMG may be a high-k last metal gate last process. Prior to the formation of the interface layer 204, the fabrication method may also include forming a dummy gate structure on a portion of the surface of the substrate 201, forming a source region and a drain region in the substrate 201 on the two sides of the dummy gate structure, and forming an interlayer dielectric layer 203 on the surface of the substrate 201. The interlayer dielectric layer 203 may cover the sidewall surfaces of the dummy gate structure. The fabrication process may further include removing the dummy gate structure to expose the surface of the substrate 201, and then forming the interface layer 204 in the exposed portion of surface of the substrate 201.

In one embodiment, the high-k dielectric layer 207 may also be formed on the top and the sidewall surfaces of the interlayer dielectric layer 203.

The materials and the fabrication methods used to form the interface layer 204 and the high-k dielectric layer 207, as well as the material used to form the substrate 201 may be referred to the corresponding descriptions in the previous embodiments.

Further, returning to FIG. 13, a first annealing process may be performed on the high-k dielectric layer and the interface layer under a nitrogen-containing environment (S402). FIG. 10 shows a schematic view of the first annealing process.

Referring to FIG. 10, a first annealing process 205 may be performed on the high-k dielectric 207 and the interface layer 204. The first annealing process 205 may be performed in a nitrogen-containing environment to let nitrogen ions diffuse into the high-k dielectric layer 207.

The first annealing process 205 may be performed for several purposes. First, the first annealing process may reduce the oxygen vacancies in the high-k dielectric layer 207. Specifically, because the first annealing process is performed in a nitrogen-containing environment, nitrogen ions may diffuse into the high-k dielectric layer such that the oxygen vacancies in the high-k dielectric layer 207 may be reduced. As a result, the dielectric relaxation issue in the high-k dielectric layer 207 may be suppressed. Second, the first annealing process may also improve the compactness and the relative dielectric constant of the high-k dielectric layer 207. Third, the first annealing process 205 may not only improve the compactness of the interface layer 204, but also let the non-bonded oxygen ions in the interface layer 204 diffuse into the high-k dielectric layer 207. As the non-bonded oxygen ions occupy the positions of the oxygen vacancies, the oxygen vacancies in the high-k dielectric layer 207 may be further deactivated, and thus the oxygen vacancies in the high-k dielectric layer 207 may be further reduced.

The first annealing process 205 may use a gas including $NH_3$. In addition, the gas in the first annealing process 205 may also include $N_2$. In one embodiment, the process parameters used in the first annealing process 205 may include an annealing temperature in a range of 400° C. to 1000° C., a chamber pressure in a range of 1 Torr to 1 atm., an annealing time in a range of 10 minutes to 120 minutes. Moreover, using a moderate annealing temperature and a moderate annealing chamber pressure during the first annealing process 205 may effectively control the amount of the nitrogen ions entering the high-k dielectric layer 207, and thus prevent the high-k dielectric layer 207 from having a low relative dielectric constant due to an overly large density of the nitrogen ions.

In other embodiment, besides the nitrogen-containing gas, a fluorine-containing gas and/or a hydrogen-containing gas may also be used in the first annealing process. That is, the process environment may also include a fluorine-containing gas and/or a hydrogen-containing gas in addition to the nitrogen-containing gas. Specifically, in one embodiment, the first annealing process may be performed under an environment containing both nitrogen ions and fluorine ions. For example, the gas used in the first annealing process may include $NH_3$ and $NF_3$. In addition, the gas used in the first annealing process may also include $N_2$. In another embodiment, the first annealing process may be performed under an environment containing nitrogen ions, hydrogen ions, and fluorine ions. For example, the gas used in the first annealing process may include $NH_3$, $NF_3$, $N_2$, and HF.

Further, returning to FIG. 13, a gate electrode layer may be formed on the high-k dielectric layer to complete a high-k metal gate structure (S403). FIG. 11 shows a schematic cross-section view of the corresponding semiconductor structure.

Referring to FIG. 11, a gate electrode layer 209 may be formed on the surface of the high-k dielectric layer 207. The top surface of the gate electrode layer 209 may be leveled with the top surface of the interlayer dielectric layer 203. The material and the fabrication methods used to form the gate electrode layer 209 may be referred to the corresponding descriptions in the previous embodiments.

In one embodiment, a portion of the high-k dielectric layer 207 formed above the top surface of the interlayer dielectric layer 203 may be removed.

In one embodiment, the density of active oxygen vacancies in the high-k dielectric layer 207 may be reduced, and thus the dielectric relaxation issue in the high-k dielectric layer 207 may be suppressed, leading to a reduced relaxation current in the semiconductor structure. Therefore, the disclosed fabrication methods and the semiconductor structures may suppress the PBTI characteristics and the NBTI characteristics, and the electrical performance of the semiconductor structure may be improved.

In one embodiment, the HKMG may be formed by a high-k last metal gate last process. In other embodiments, the HKMG may also be formed by a high-k first metal gate last process. Specifically, the interface layer may be formed on the entire surface of the substrate. Then, before forming the gate electrode layer on the surface of the high-k dielectric layer, a first annealing process may be performed on the high-k dielectric layer. Further, a dummy gate film may be formed on the surface of the high-k dielectric. Then, the dummy gate film and the high-k dielectric layer may be patterned to form the dummy gate structure on the surface of the patterned high-k dielectric layer. Further, a source region and a drain region may be formed in the substrate on the two sides of the dummy gate structure. Finally, the dummy gate structure may be removed and then a gate electrode layer may be formed on the surface of the high-k dielectric layer.

In another embodiment, the HKMG may also be formed by a high-k first metal gate last process. Specifically, an interface layer may be initially formed on the entire surface of the substrate. A high-k dielectric layer may then be formed on the surface of the interface layer. After performing the first annealing process on the high-k dielectric layer, a gate electrode layer may then be formed on the surface of the high-k dielectric layer. Further, the gate electrode layer and the high-k dielectric layer may be patterned to form a gate structure, and a source region and a drain region may be formed in the substrate on the two sides of the gate structure. Finally, an interlayer dielectric layer may be formed on the surface of the substrate on both sides of the gate structure. The top surface of the formed interlayer dielectric layer may be leveled with the top surface of the gate structure.

The present disclosure also provides a semiconductor structure. The semiconductor structure may include a substrate, a plurality of interface layers formed on the substrate, a plurality of gate structures formed on the surfaces of the plurality of interface layers, and an interlayer dielectric layer formed on the surface of the substrate as well as the sidewall surfaces of the gate structures. A source region and a drain region may be formed in the substrate on the two sides of each gate structure. Each gate structure may further include a high-k dielectric layer formed over a corresponding interface layer and a gate electrode layer formed on the high-k dielectric layer. Oxygen vacancies initially formed in the high-k dielectric layer may be reduced by one or more annealing treatments performed during the fabrication process.

Specifically, in one embodiment, prior to forming the high-k dielectric layer, a first annealing process may be performed on the interface layer. The first annealing process may be performed under a nitrogen-containing environment. Therefore, a nitrogen-containing layer may be formed on the surface of the interface layer.

The first annealing process may help deactivate non-bonded silicon ions and non-bonded oxygen ions in the interface layer. The non-bonded silicon ions and the non-bonded oxygen ions in the interface layer may undergo a chemical bond reconstruction process such that the properties of the interface layer may be improved.

Further, a second annealing process may be performed on the high-k dielectric layer prior to forming the gate electrode layer. The second annealing process may improve the compactness and the relative dielectric constant of the high-k dielectric layer. In addition, the second annealing process may also reduce the density of active oxygen vacancies in the high-k dielectric layer. After performing the second annealing process, the dielectric relaxation issue in the high-k dielectric layer may be suppressed and the relaxation current in the semiconductor structure may also be reduced. Therefore, the disclosed fabrication methods and semiconductor structures may suppress the PBTI characteristics and the NBTI characteristics so that the electrical performance of the semiconductor structures may be improved.

The process parameters for the first annealing process and the second annealing process may be referred to the corresponding descriptions in the previous embodiments.

In another embodiment, after forming the interface layer on the surface of the substrate, a high-k dielectric layer may be formed on the interface layer. A first annealing process may then be performed on the high-k dielectric layer and the interface layer under a nitrogen-containing environment. Specifically, the first annealing process may let the non-bonded oxygen ions in the interface layer diffuse into the high-k dielectric layer so that the oxygen vacancies in the high-k dielectric layer may be reduced. In the meantime, nitrogen ions from the nitrogen-containing environment may also diffuse into the high-k dielectric layer to further deactivate oxygen vacancies in the high-k dielectric layer. As such, the dielectric relaxation issue in the high-k dielectric layer may be suppressed and the electrical performance of the semiconductor structure may be improved.

The process parameters for the first annealing process may be referred to the corresponding descriptions in the previous embodiments.

Compared to existing semiconductor structures and fabrication methods, the disclosed semiconductor structures and the fabrication methods may demonstrate several advantages.

According to the disclosed semiconductor structures and fabrication methods, after forming an interface layer, a first annealing process may be performed on the interface layer. The first annealing process may be performed under a nitrogen-containing environment to let the surface of the interface layer form a nitrogen-containing layer. In addition, the first annealing process may also deactivate non-bonded silicon ions and non-bonded oxygen ions in the interface layer, and thus improve the properties of the interface layer. Further, a high-k dielectric layer may be formed on the nitrogen-containing layer and then a second annealing process may be performed on the high-k dielectric layer. The second annealing process may let the nitrogen ions in the nitrogen-containing layer diffuse into the high-k dielectric layer. The nitrogen ions diffused into the high-k dielectric layer may deactivate the oxygen vacancies in the high-k dielectric layer so that the density of active oxygen vacancies in the high-k dielectric layer may be reduced and the dielectric relaxation issue in the high-k dielectric layer may be suppressed. As such, the electrical performance of the semiconductor structure may be improved and the PBTI and the NBTI characteristics may be suppressed.

Further, the first annealing process may be performed in an environment including a fluorine-containing gas and/or a hydrogen-containing gas in addition to the nitrogen-containing gas. Therefore, after the first annealing process, the nitrogen-containing layer may also contain fluorine ions and/or hydrogen ions. During the subsequently-performed second annealing process, the fluorine ions and/or hydrogen ions may diffuse into the high-k dielectric layer, and thus further deactivate the oxygen vacancies in the high-k dielectric layer.

Alternatively, to form the disclosed semiconductor structures, after the formation of an interface layer, a high-k dielectric layer may be formed on the surface of the interface layer, and then a first annealing process may be performed on the high-k dielectric layer and the interface layer. The first annealing process may be performed under a nitrogen-containing environment to let nitrogen ions diffuse into the high-k dielectric layer. Specifically, during the first annealing process, non-bonded oxygen ions in the interface layer may diffuse into the high-k dielectric layer to reduce the oxygen vacancies in the high-k dielectric layer. In addition, during the first annealing process, nitrogen ions from the nitrogen-containing environment may diffuse into the high-k dielectric layer to deactivate the oxygen vacancies in the high-k dielectric layer, and thus further reduce the density of active oxygen vacancies in the high-k dielectric layer. As such, the dielectric relaxation issue in the high-k dielectric layer may be suppressed and the electrical performance of the semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A method for fabricating a semiconductor structure, comprising:
   providing a substrate;
   forming an interface layer on the substrate, wherein prior to forming the interface layer:
      forming a plurality of dummy gate structures on the substrate;
      forming a source region and a drain region in the substrate on both sides of each dummy gate structure;
      forming an interlayer dielectric layer on the substrate with the interlayer dielectric layer covering sidewall surfaces of each dummy gate structure; and
      removing each dummy gate structure to expose a portion of a top surface of the substrate;
   performing a first annealing process on the interface layer under a nitrogen-containing environment to form a nitrogen-containing layer from a top portion of the interface layer, wherein the first annealing process also deactivates non-bonded silicon ions and oxygen ions in the interface layer;
   forming a high-k dielectric layer on the nitrogen-containing layer;
   performing a second annealing process on the high-k dielectric layer to allow nitrogen ions in the nitrogen-containing layer to diffuse into the high-k dielectric layer to reduce a density of active oxygen vacancies in the high-k dielectric layer; and
   forming a gate electrode layer on the high-k dielectric layer.

2. The method for fabricating the semiconductor structure according to claim 1,
   wherein:
   the interface layer is made of $SiO_x$ or SiON; and
   the high-k dielectric layer is made of one of $HfO_2$, HfSiO, HfSiON, HfTaO, HfSiO, HfZrO, $ZrO_2$, and $Al_2O_3$.

3. The method for fabricating the semiconductor structure according to claim 1, wherein the first annealing process uses a gas including $NH_3$.

4. The method for fabricating the semiconductor structure according to claim 1, wherein process parameters used in the first annealing process include:

an annealing temperature in a range of 400° C. to 1100° C.;
a chamber pressure in a range of 1 Torr to 1 amt.; and
an annealing time in a range of 10 minutes to 120 minutes.

5. The method for fabricating the semiconductor structure according to claim 1, wherein process parameters used in the second annealing process include:
   an annealing temperature in a range of 400° C. to 1100° C.;
   a chamber pressure in a range of 1 Torr to 1 amt.; and
   an annealing time in a range of 10 minutes to 120 minutes.

6. The method for fabricating the semiconductor structure according to claim 1, wherein the interface layer is formed on an entire surface of the substrate and after forming the gate electrode layer, the method further includes:
   forming a plurality of gate structures by patterning the gate electrode layer and the high-k dielectric layer;
   forming a source region and a drain region in the substrate on both sides of each gate structure; and
   forming an interlayer dielectric layer on the substrate with the interlayer dielectric layer covering sidewall surfaces of each gate structure.

7. The method for fabricating the semiconductor structure according to claim 1, wherein:
   the high-k dielectric layer on the nitrogen-containing layer is formed after performing the first annealing process on the interface layer.

8. The method for fabricating the semiconductor structure according to claim 1, further comprising:
   forming a sidewall spacer on each sidewall surface of the dummy gate structure.

9. A method for fabricating a semiconductor structure, comprising:
   providing a substrate;
   forming an interface layer on the substrate:
   performing a first annealing process on the interface layer under a nitrogen-containing environment to form a nitrogen-containing layer from a top portion of the interface layer, wherein the first annealing process also deactivates non-bonded silicon ions and oxygen ions in the interface layer, wherein
   a gas used in the first annealing process further includes at least one of a fluorine-containing gas and a hydrogen-containing gas;
   forming a high-k dielectric layer on the nitrogen-containing layer;
   performing a second annealing process on the high-k dielectric layer to allow nitrogen ions in the nitrogen-containing layer to diffuse into the high-k dielectric layer to reduce a density of active oxygen vacancies in the high-k dielectric layer; and
   forming a gate electrode layer on the high-k dielectric layer.

10. The method for fabricating the semiconductor structure according to claim 9, wherein the gas used in the first annealing process includes at least one of $NF_3$ and $H_2$.

11. A method for fabricating a semiconductor structure, comprising:
   providing a substrate;
   forming an interface layer on the substrate, wherein prior to forming the interface layer:
      forming a plurality of dummy gate structures on the substrate;
      forming a source region and a drain region in the substrate on both sides of each dummy gate structure;
      forming an interlayer dielectric layer on the substrate with the interlayer dielectric layer covering sidewall surfaces of each dummy gate structure; and removing each dummy gate structure to expose a portion of a top surface of the substrate;

forming a high-k dielectric layer on the interface layer;

performing a first annealing process on the high-k dielectric layer and the interface layer under a nitrogen-containing environment to allow nitrogen ions from the nitrogen-containing environment and non-bonded oxygen ions in the interface layer to respectively diffuse into the high-k dielectric layer to reduce a density of active oxygen vacancies in the high-k dielectric layer; and forming a gate electrode layer on the high-k dielectric layer.

12. The method for fabricating the semiconductor structure according to claim 11, wherein:

the interface layer is made of $SiO_x$ or SiON; and the high-k dielectric layer is made of one of $HfO_2$, HfSiO, HfSiON, HfTaO, HfSiO, HfZrO, $ZrO_2$, and $Al_2O_3$.

13. The method for fabricating the semiconductor structure according to claim 11, wherein the first annealing process uses a gas including $NH_3$.

14. The method for fabricating the semiconductor structure according to claim 11, wherein a gas used in the first annealing process further includes at least one of a fluorine-containing gas and a hydrogen-containing gas.

15. The method for fabricating the semiconductor structure according to claim 14, wherein the gas used in the first annealing process includes at least one of $NF_3$ and $H_2$.

16. The method for fabricating the semiconductor structure according to claim 11, wherein process parameters used in the first annealing process include:

an annealing temperature in a range of 400° C. to 1000° C.;

a chamber pressure in a range of 1 Torr to 1 amt.; and an annealing time in a range of 10 minutes to 120 minutes.

17. The method for fabricating the semiconductor structure according to claim 11, wherein the interface layer is formed on an entire surface of the substrate and after forming the gate electrode layer, the method further includes:

forming a plurality of gate structures by patterning the gate electrode layer and the high-k dielectric layer;

forming a source region and a drain region in the substrate on both sides of each gate structure; and forming an interlayer dielectric layer on the substrate with the interlayer dielectric layer covering sidewall surfaces of each gate structure.

18. The method for fabricating the semiconductor structure according to claim 11, wherein:

the high-k dielectric layer on the nitrogen-containing layer is formed after performing the first annealing process on the interface layer.

19. The method for fabricating the semiconductor structure according to claim 11, further comprising:

forming a sidewall spacer on each sidewall surface of the dummy gate structure.

* * * * *